(12) United States Patent
Okada

(10) Patent No.: US 10,322,462 B2
(45) Date of Patent: Jun. 18, 2019

(54) METHOD OF PRINTING SOLDER PASTE

(71) Applicant: Senju Metal Industry Co., Ltd., Tokyo (JP)

(72) Inventor: Sakie Okada, Tochigi (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 124 days.

(21) Appl. No.: 15/394,243

(22) Filed: Dec. 29, 2016

(65) Prior Publication Data

US 2017/0157691 A1 Jun. 8, 2017

Related U.S. Application Data

(62) Division of application No. 14/125,916, filed as application No. PCT/JP2012/064801 on Jun. 8, 2012.

(30) Foreign Application Priority Data

Jun. 8, 2011 (JP) .................................. 2011-131465

(51) Int. Cl.
| | | |
|---|---|---|
| *B23K 1/00* | (2006.01) | |
| *B23K 3/06* | (2006.01) | |
| *B23K 3/08* | (2006.01) | |
| *B23K 35/36* | (2006.01) | |
| *B23K 35/362* | (2006.01) | |
| *B23K 35/02* | (2006.01) | |
| *H05K 3/12* | (2006.01) | |
| *H05K 3/34* | (2006.01) | |
| *B23K 35/26* | (2006.01) | |
| *C22C 13/00* | (2006.01) | |
| *H05K 3/04* | (2006.01) | |
| *H05K 3/40* | (2006.01) | |
| *B23K 101/42* | (2006.01) | |

(52) U.S. Cl.
CPC .......... *B23K 1/0016* (2013.01); *B23K 3/0638* (2013.01); *B23K 3/082* (2013.01); *B23K 35/025* (2013.01); *B23K 35/0244* (2013.01); *B23K 35/262* (2013.01); *B23K 35/362* (2013.01); *B23K 35/3612* (2013.01); *B23K 35/3613* (2013.01); *C22C 13/00* (2013.01); *H05K 3/04* (2013.01); *H05K 3/1233* (2013.01); *H05K 3/3484* (2013.01); *H05K 3/4007* (2013.01); *B23K 2101/42* (2018.08); *H05K 2203/0139* (2013.01); *H05K 2203/085* (2013.01)

(58) Field of Classification Search
CPC ............................. B23K 35/025; B23K 1/0016
USPC ......................................................... 148/24
See application file for complete search history.

(56) References Cited

U.S. PATENT DOCUMENTS

2014/0113109 A1* 4/2014 Kurita ....................... C22C 5/06
428/148

FOREIGN PATENT DOCUMENTS

| CN | 1357454 A | 7/2002 |
|---|---|---|
| CN | 1655933 A | 8/2005 |
| CN | 1876311 A | 12/2006 |
| CN | 101134389 A | 3/2008 |
| CN | 101310977 A | 11/2008 |
| JP | H06-087090 A | 3/1994 |
| JP | 2003-25089 A | 1/2003 |
| JP | 2004-167709 A | 6/2004 |
| JP | 2005-088528 A | 4/2005 |
| JP | 2007-222932 A | 9/2007 |
| JP | 2008-055607 A | 3/2008 |
| JP | 2008055607 A * | 3/2008 |
| JP | 2008221541 A | 9/2008 |
| JP | 0004198972 B | 12/2008 |
| JP | 2009542019 A | 11/2009 |
| JP | 2010-109041 A | 5/2010 |
| JP | 2001-160684 A | 12/2011 |
| KR | 10-20080020502 A | 3/2008 |
| TW | 200701260 A | 1/2007 |
| WO | 2007034758 A1 | 3/2007 |
| WO | 2012-173059 A1 | 12/2012 |

OTHER PUBLICATIONS

Japan Patent Office, Notification of Rejection Reason(s), issued in Japanese Patent Application No. 2013-520529, dated Jan. 21, 2014.
Notification of Rejection for corresponding Japanese Patent Application No. 2014-164829, dated Jun. 30, 2015, 10 pgs. including English translation.
Taiwan Intellectual Property Office, Examination Report issued in Taiwan Patent Application No. 101121055, dated Sep. 22, 2016, 7 pages.

(Continued)

*Primary Examiner* — Weiping Zhu

(74) *Attorney, Agent, or Firm* — Chernoff, Vilhauer, McClung & Stenzel, LLP

(57) ABSTRACT

A method of printing solder paste on a substrate through minute apertures in a mask member, in which the solder paste is supplied to the apertures of the mask member under less than atmospheric pressure and has a viscosity so that the solder paste is filled in the apertures under atmospheric pressure. It is preferable that the solder paste has a viscosity of 50 through 150 Pa·s and a thixotropic ratio of 0.3 through 0.5. Further, the solder paste is obtained by mixing a flux containing solvent having a boiling point such that volatilization thereof is suppressed under the less than atmospheric pressure and solder powders. It is preferable that in the flux, the solvent having the boiling point of 240° C. or more is used and the solvent is octanediol.

2 Claims, 9 Drawing Sheets

(56) References Cited

OTHER PUBLICATIONS

Korean Intellectual Property Office; Office Action for Korean Application No. 10-2013-7033160, dated Jun. 7, 2018, 9 pages, inclusive of English translation.
Chinese Patent Office; Office Action dated Jul. 4, 2018 for Chinese Patent Application No. 201610832683.6, 11 pages (inclusive of English translation).

* cited by examiner

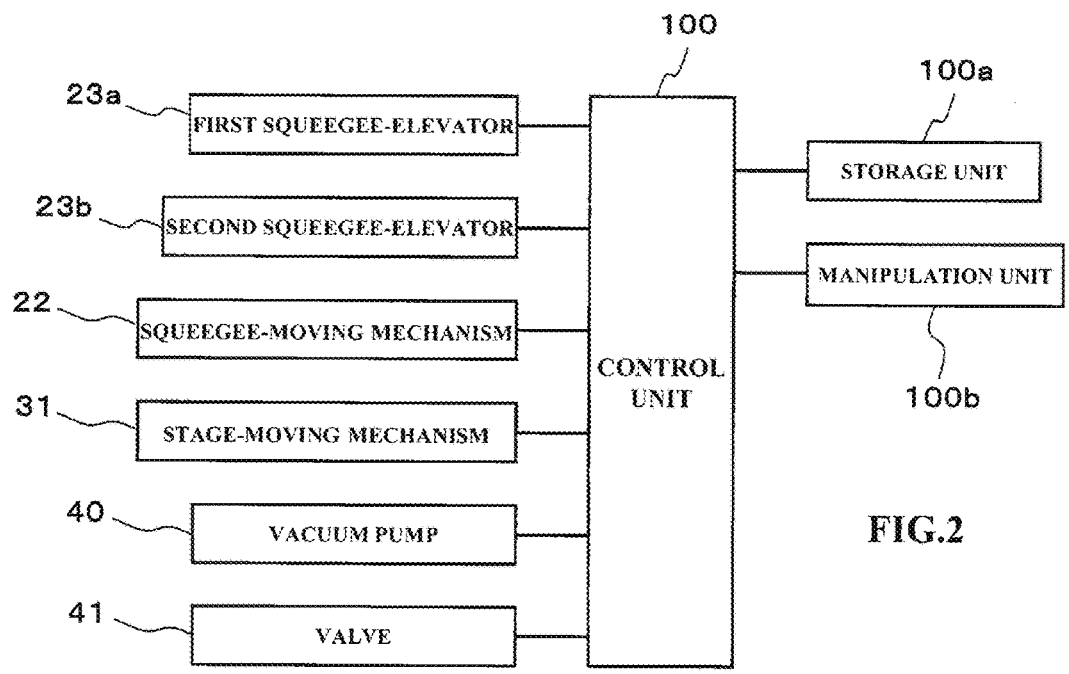
FIG.2
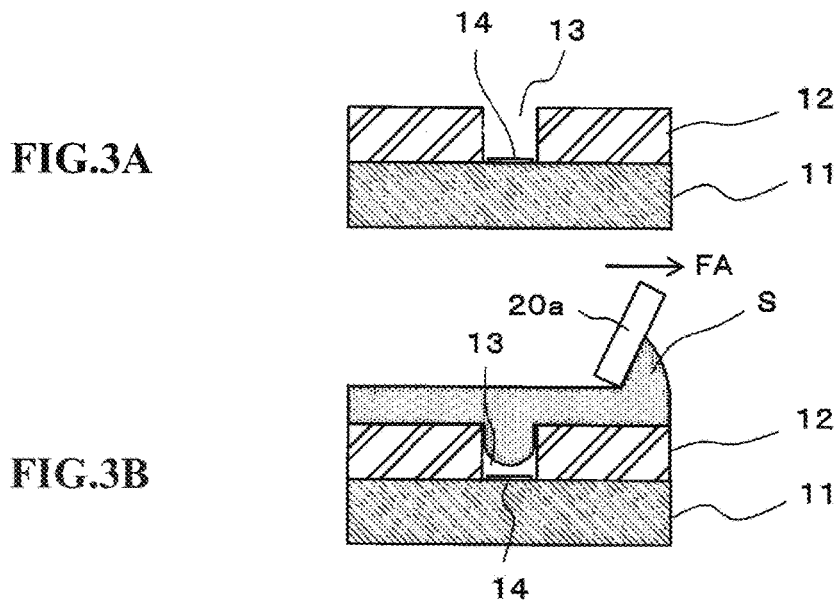
FIG.3A
FIG.3B

ASPECT RATIO: 1.3

ASPECT RATIO: 1.67

METHOD OF PRINTING SOLDER PASTE

TECHNICAL FIELD

The present invention relates to solder paste obtained by mixing a flux with solder powders and it particularly relates to solder paste that can be filled in minute apertures to form solder bumps.

BACKGROUND

A first step in SMT process that is used for assembling an electronic substrate starts from supplying on the substrate an appropriate quantity of the solder paste formed by mixing a flux with solder powders. There is a method referred to as a screen printing one of the methods of supplying the solder paste on the substrate.

FIGS. 10A, 10B, 10C, 10D, 10E and 10F are motion illustration diagrams showing an example of a conventional screen printing. In the screen printing, as shown in FIG. 10A, a screen 104 made of a steel plate in which apertures 103 are formed with them being aligned with electrodes 102 of a substrate 101 and the substrate 101 are closely contacted to each other, as shown in FIG. 10B.

The solder paste S is put on the screen 104, as shown in FIG. 10C, and sliding a squeegee 105 toward a direction of an arrow F with it closely contacting the screen 104, the solder paste S is filled in the apertures 103 as shown in FIG. 10D. Next, by scraping the excessive solder paste S off using the squeegee 105, the solder paste S is filled in only the apertures 103 of the screen 104, as shown in FIG. 10E.

Thereafter, as shown in FIG. 10F, by separating the screen 104 and the substrate 101 from each other, the solder paste S filled in the apertures 103 of the screen 104 is transferred to a side of the substrate 101.

The screen printing has been popularized as a method of allowing the solder paste to be accurately supplied at a lowest price when consecutively producing the substrates of same type. It also has maintained its position as the method of allowing the solder paste to be supplied to a portion to be soldered which has been extremely minimized and/or narrowed connection with miniaturization of the substrate and pitch narrowing of the electrodes.

By the way, in the SMT process, the supply of the solder paste is performed in its first step and then, a component mounting steps and then a soldering step by heating follow. If any faults occur in supplying the solder paste, these faults in supplying it cannot be covered even when the following component mounting step and the following soldering step by heating are performed under best conditions.

Accordingly, it is considered that the supply of the solder paste is the most important step in the SMT process. As a measure against the faults when printing, any optimization of viscosity of the solder paste and a size of the solder powder, any optimization of a printing condition and/or the like have been studied in the past and a printing process, though not quite satisfactory, is being fixed.

On the other side, on the assembly of electronic device, there is a printing process referred to as a film method as a method of forming solder bumps on the device, particularly. FIGS. 11A, 11B, 11C, 11D, 11E and 11F are motion illustration diagrams showing an example of a conventional film method.

In the film method, as shown in FIG. 11A, a film 106 is attached onto the substrate 101 and as shown in FIG. 11B, apertures 107 are formed in the film 106 by removing therefrom portions to which the solder paste should be supplied using etch.

By sliding the squeegee 105 with it closely contacting the film 106 while, as shown in FIG. 11D, the solder paste S is put on the film 106, the solder paste S is filled in the apertures 107 as shown in FIG. 11C. Next, by scraping the excessive solder paste S off using the squeegee 105, the solder paste S is filled in only the apertures 107 of the film 106.

Next, the substrate 101 is put into a reflow furnace while the film 106 is attached thereto and as shown in FIG. 10E, solder bumps 108 are formed. Thereafter, as shown in FIG. 11F, the film 106 is removed from the substrate 101 using a parting agent.

In the above-mentioned screen printing, the solder paste may remain in the apertures of the screen when separating the screen from the substrate in a case where the pitch narrowing of the electrodes advances and the apertures formed in the screen is made extremely small so that it will remove from the substrate. This fails in filling an inadequate amount of solder. In the film method, in contrast, by removing the film after the solder paste is fused and the solder bumps are formed, the solder bumps are formed on a side of the electrodes of the substrate so that an amount of the solder is fixed.

On the other hand, in a field of the screen printing, a technology has been proposed such that after embrocation as paste or ink is printed on printing materials by a squeegee under atmospheric pressure, the printing materials are put under predetermined high vacuum to generate air bubbles and the generated air bubble is scraped off by the squeegee as well as the printing materials return to the atmospheric pressure to further break down the air bubbles so that any air bubbles can be removed from the embrocation (for example, see Patent Document 1).

DOCUMENT FOR PRIOR ART

Patent Document

Patent Document 1: Japanese Patent No. 4198972

SUMMARY OF THE INVENTION

Problems to be Solved by the Invention

In both of the screen printing and the film method, however, when miniaturization of aperture advances, it has been impossible to fill the solder paste in the apertures completely in a case where the solder paste enters into the apertures so that a proper print amount cannot be obtained.

FIGS. 12A, 12B and 12C are illustration diagrams showing conventional problems. In FIGS. 12A, 12B and 12C, the screen printing is illustrated. As shown in FIG. 12A, a ratio of a thickness L2 of the screen 104 to a diameter LI of the aperture 103 formed in the screen 104 is referred as an aspect ratio (L2/L1). When the aspect ratio exceeds 0.5, it becomes impossible to fill the solder paste in the whole of the aperture merely by pressure force of the squeegee.

In order to fill the solder paste in the aperture, it is requested that air is exchanged with the solder paste in the aperture. When the aperture is made extremely miniaturized and the aspect ratio becomes large, an air layer 110 around a bottom of the aperture 103 is formed, as shown in FIG. 12B, because when the solder paste enters into the aperture, it blocks an escape way of air. That may cause a situation such that the solder paste S does not contact the electrode 102 at the bottom of the aperture 103 to occur.

Thus, when the aperture is made extremely miniaturized and the aspect ratio becomes large, in the screen printing, as shown in FIG. 12C, a printing state becomes unstable such as a less print amount when the screen 104 is separated from the substrate 104. On the other hand, in the film method, heights of the formed solder bumps become unstable. Additionally, since when printing, the situation such that the solder paste does not contact the electrode at the bottom of the aperture occurs, the fused solder blocks the aperture of the film at a period of heating time so that so-called missing bump in which no solder bump is formed on the substrate is generated.

Successively, if a substrate on which the solder paste is printed is put in vacuum to remove any air babbles, it is impossible to fill the solder paste in the whole of the aperture after the air bubbles are removed merely by the pressure force of the squeegee when the miniaturization of aperture advances.

The present invention solves such problems and has an object to provide solder paste that can be filled in minute apertures.

Means for Solving the Problems

Inventors have found out such a fact that after solder paste is printed on a substrate under a predetermined decompression condition and the solder paste is supplied to the apertures of the screen or film, the substrate is put under atmospheric pressure so that if there is any space in the aperture, this space becomes under negative pressure and the solder paste can be filled in the apertures under atmospheric pressure.

On the other hand, even if the printing is performed while environments in which the substrate on which the solder paste is printed is put are switched to one under atmospheric pressure and one under the decompression pressure, conventional solder paste may not be filled in the apertures in which the miniaturization of aperture advances.

Accordingly, the inventors have also found out such a fact that in the printing while environments in which the substrate on which the solder paste is printed is put are switched to one under atmospheric pressure and one under the decompression pressure, it is possible to fill the solder paste in the minute apertures due to viscosity of the solder paste. Further, they have found out such a fact that controlling volatilization of solvent in the flux constituting the solder paste under the decompression pressure allows a variation in the viscosity of the solder paste to be suppressed.

This invention relates to solder paste that is printed on the substrate through a mask member in which aperture is formed and that is supplied to the aperture of the mask member under decompression pressure and has a viscosity so that it is filled in the aperture under atmospheric pressure.

It is preferable that the solder paste has a viscosity of 50 through 150 Pa·s and a thixotropic ratio of 0.3 through 0.5. Further, the solder paste is obtained by mixing a flux containing solvent having a boiling point such that volatilization thereof is suppressible under the decompression pressure and solder powders. It is preferable that in the flux, the solvent having the boiling point of 240° C. or more is used and the solvent is octanediol.

In this invention, the solder paste is supplied to the mask member in which the aperture is formed and the solder paste is printed on a substrate under predetermined decompression pressure. After the printing under the decompression pressure, the environments in which the substrate is put are switched to the atmospheric pressure so that the solder paste is filled in the aperture under atmospheric pressure. In the printing under the decompression pressure, a solder paste coat having a predetermined thickness is formed on the mask member and when the environments in which the substrate is put are switched to the atmospheric pressure, the solder paste is filled in the aperture under atmospheric pressure utilizing the solder paste coat on the mask member.

In the film method, the excessive solder paste on the mask member is scraped off, the substrate is heated to fuse the solder paste so that solder bumps are formed. The mask member is then removed from the substrate. In the screen printing, the excessive solder paste on the mask member is scraped off and the mask member is separated from the substrate. Electronic components and the like are then mounted and the substrate is heated so that the soldering is performed.

Effects of the Invention

The solder paste according to the invention has a viscosity such that it can be filled in the minute aperture under atmospheric pressure, in addition to the pressure by a pressing member, so that after the solder paste is printed on the substrate under the predetermined decompression pressure to supply the solder paste to the aperture in the mask member, the substrate is put under atmospheric pressure and even if there is a space in the aperture, the solder paste can be filled in the aperture under atmospheric pressure.

Accordingly, in the film method, it is possible to suppress a variation in the heights of the solder bumps and it is possible to suppress the missing bump in which no solder bump is formed.

In the screen printing, it is also possible to maintain a print amount certainly even in the minute aperture.

BRIEF DESCRIPTION OF DRAWINGS

FIG. 2 is a functional block diagram showing an example of a control function of the solder printing machine according to the embodiment.

FIG. 3A is a motion illustration diagram showing an example of a printing method of solder paste according to the embodiment.

FIG. 3B is a motion illustration diagram showing the example of the printing method of solder paste according to the embodiment.

FIG. 116 is a motion illustration diagram showing the example of the conventional film method.

EMBODIMENT FOR CARRYING OUT THE INVENTION

Composition Example of Solder Paste According to the Embodiment

Solder paste according to the embodiment is printed on a substrate by a screen method using a screen as mask member or a film method using a film as the mask member. In the solder paste according to the embodiment, the printing by the screen method or the film method is performed under a predetermined decompression condition, in this embodiment, vacuum condition.

The solder paste according to the embodiment is produced so that the flux containing solvent having a constituent such that volatilization thereof is suppressible under vacuum condition is mixed with solder powders. Further, the solder paste according to this embodiment has a viscosity so that it is pushed into the apertures in the screen or the film by pressure force of a squeegee and it is pushed into the apertures under atmospheric pressure when it is opened from the vacuum condition to the atmospheric pressure.

A degree of volatilization of a material is dependent on vapor pressure of the material. Vapor pressure of a material at a temperature is uniquely fixed and at a boiling point that is a temperature while the vapor pressure is equal to an external pressure, the volatilization of the material becomes maximum. The volatilization of material under vacuum condition has, generally, such a tendency that the volatilization of material having higher boiling point is more suppressible than that of material having lower boiling point.

Accordingly, in the solder paste according to the embodiment, the flux containing a solvent, the boiling point of which is more than a predetermined temperature, is used. In the embodiment, it is preferable that the solvent, the boiling point of which is of 240° C. or more, is used. For example, octanediol, the boiling point of which is 243.2° C., is used.

Moreover, on the viscosity of the solder paste, it is preferable that in order to allow the solder paste to be filled in the apertures of the screen or the film by the pressure force of the squeegee and the atmospheric pressure, particularly, in order to allow the solder paste to be filled in even the minute apertures, its viscosity is lowered. Further, it is preferable that a thixotropic ratio is lower, in which stress is small against displacement. In this embodiment, it is preferable that the solder paste has a viscosity of about 50 through 150 Pa·s and the thixotropic ratio of about 0.3 through 0.5.

Figure 1:
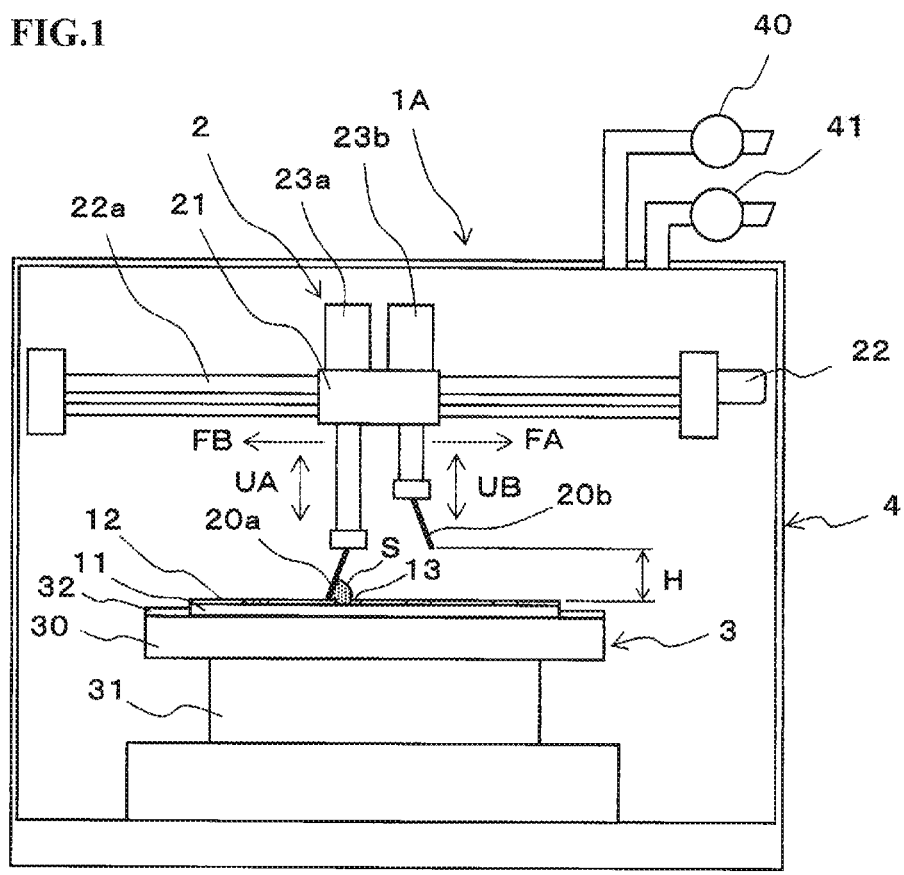
FIG. 1 is a configuration diagram showing an example of a solder printing machine according to an embodiment of the present invention.

Configuration Example of Solder Printing Machine According to the Embodiment FIG. 1 is a configuration diagram showing an example of a solder printing machine according to the embodiment and shows a case where it is applied to the film method using the film as the mask member. The solder printing machine 1A according to the embodiment is provided with a printing mechanism 2 that prints solder paste S on a substrate 11, a substrate-supporting mechanism 3 that supports the substrate 11 on which the printing mechanism 2 prints the solder paste S, and a printing room 4 housing the printing mechanism 2 and the substrate-supporting mechanism 3.

In the solder printing machine 1A, in order to print the solder paste S on a predetermined position of the substrate 11, a film 12 to be attached to the substrate 11 is used. The film 12 has photosensitivity such that it is cured by irradiating thereto light having a predetermined wavelength range, in this embodiment, ultraviolet (UV) rays. In the substrate 11, the film 12 is attached to a surface thereof on which the solder paste S is printed and the ultraviolet rays are irradiated to any positions other than positions of electrodes on which the solder paste S is printed.

On the substrate 11, portions of the film 12 to which the ultraviolet rays are irradiated are cured and positions on which the solder paste S is not printed are covered by the film 12. Further, on the substrate 11, portions of the film 12 to which the ultraviolet rays are not irradiated are removed by chemicals or the like so that any apertures 13 having predetermined dimensions are formed with them being aligned to positions of electrodes or the like to which the solder paste S is printed.

The printing mechanism 2 is provided with a first squeegee 20a and a second squeegee 20b, which move toward predetermined printing directions along the substrate 11 to which the film 12 is attached and perform the filling and scraping of the solder paste S. The printing mechanism 2 is also provided with a squeegee portion 21 on which the first squeegee 20a and the second squeegee 20b are proved and a squeegee-moving mechanism 22 that moves the first squeegee 20a and the second squeegee 20b toward the predetermined printing directions.

The first squeegee 20a and the second squeegee 20b are plate members made of single material such as rubber, resin or metal or plate members made of a combination of their materials such as a portion thereof contacting the film 12 is made of rubber and other portion thereof is made of metal.

The printing mechanism 2 is configured so that a moving direction of the squeegee portion 21 moved by the squeegee-moving mechanism 22 is guided by a guide member 22a and the squeegee portion 21 can reciprocate along the substrate 11 to which the film 12 is attached. In the printing mechanism 2, by the reciprocation of the squeegee portion 21, the first squeegee 20a and the second squeegee 20b move toward a first printing direction FA along the substrate 11 on which the film 12 is attached and a second printing direction FB that is an opposite direction to the first printing direction FA.

The printing mechanism 2 is configured so that the squeegee portion 21 is provided with a first squeegee-elevator 23a that elevates the first squeegee 20a and a second squeegee-elevator 23b that elevates the second squeegee 20b.

The printing mechanism 2 is also configured so that the first squeegee 20a moves along a raising or lowering direction UA by means of the first squeegee-elevator 23a and the first squeegee 20a moves to a direction such that it contacts the substrate 11 to which the film 12 is attached or it is away from the substrate 11.

The printing mechanism 2 is configured so that by limiting an amount of movement of the first squeegee 20a along the raising or lowering direction UA, an interval H of a lower end of the first squeegee 20a and the film 12, an attack angle that is an angle of the first squeegee 20a against the film 12, the pressure force by the first squeegee 20a against the film 12 and the like are adaptable.

In the printing mechanism 2, the second squeegee 20b is also configured so as to be similar thereto and the second squeegee 20b moves along a raising or lowering direction UB by means of the second squeegee-elevator 23b and the second squeegee 20b moves to a direction such that it contacts the substrate 11 to which the film 12 is attached or it is away from the substrate 11.

The printing mechanism 2 is configured so that by limiting an amount of movement of the second squeegee 20b along the raising or lowering direction UB, an interval H of a lower end of the second squeegee 20b and the film 12, an attack angle that is an angle of the second squeegee 20b against the film 12, the pressure force by the second squeegee 20b against the film 12 and the like are adaptable.

In the printing mechanism 2, the squeegee portion 21 is provided with the first squeegee-elevator 23a and the second squeegee-elevator 23b so that the first squeegee 20a and the second squeegee 20b independently move to the raising and lowering directions and move toward the predetermined printing directions while their positions along the raising or lowering direction are kept at their set positions.

The substrate-supporting mechanism 3 is provided with a stage 30 mounting the substrate 11 to which the film 12 is attached, and a stage-moving mechanism 31 that moves the stage 30. The stage 30 is provided with a clamp mechanism 32 removably holding the substrate 11 with an optional dimension, to which the film 12 is attached. The stage-moving mechanism 31 is provided with a mechanism for vertically and horizontally moving the stage 30 and allows the substrate 11 to which the film 12 is to be aligned.

The printing room 4 is configured to have a space housing the above-mentioned printing mechanism 2 and substrate-supporting mechanism 3 and is provided with a vacuum pump 40 and a valve 41. The printing room 4 keeps its airtightness by closing the valve 41 and becomes a desired vacuum condition by exhausting air using the vacuum pump 40. The printing room 4 is opened from the vacuum condition to the atmospheric pressure by opening the valve 41.

Functional Configuration Example of Solder Printing Machine According to the Embodiment FIG. 2 is a functional block diagram showing an example of a control function of the solder printing machine according to the embodiment. The solder printing machine 1A is provided with a control unit 100 constituted of a microcomputer and the like. The control unit 100 is an example of control means and carries out any programs stored in a storage unit 100a to perform a series of processes for printing the solder paste on the substrate based on setting by a manipulation unit 100b.

The control unit 100 controls the vacuum pump 40 and the valve 41 following steps previously set by the programs for carrying out a series of processes of printing the solder paste S on the substrate 11 and switches the printing room 4 shown in FIG. 1 to either the vacuum condition or the condition opened to the atmospheric pressure.

The control unit 100 also controls the squeegee-moving mechanism 22 to allow the first squeegee 20a and the second squeegee 20b to move to the first printing direction FA and the second printing direction FB. Further, the control unit 100 controls the first squeegee-elevator 23a to allow the first squeegee 20a to move toward the raising or lowering direction UA and controls the second squeegee-elevator 23b to allow the second squeegee 20b to move toward the raising or lowering direction UB. The control unit 100 additionally controls the stage-moving mechanism 31 to allow the stage 30 to move vertically or horizontally.

In a step of making the printing room 4 vacuum condition, the control unit 100 fills the solder paste S in the apertures 13 of the film 12 attached to the substrate 11 following the printing directional movement of the first squeegee 20a or the second squeegee 20b. Moreover, it forms a coat of the solder paste S on the film 12 by the printing directional movement of the first squeegee 20a or the second squeegee 20b when filling the solder paste S in the apertures 13 of the film 12.

Accordingly, in the step of making the printing room 4 vacuum condition, the control unit 100 sets so as to have a predetermined gap between the lower end of the first squeegee 20a or the second squeegee 20b and the film 12.

In other words, the control unit 100 sets the interval H between the lower end of the first squeegee 20a and the film 12 to have a predetermined gap such that it is possible to fill the solder paste S in the apertures 13 of the film 12 and form the coat of solder paste S on the film 12 by the movement of the first squeegee 20a to the first printing direction FA.

Alternatively, the control unit 100 sets the interval H between the lower end of the second squeegee 20b and the film 12 to have a predetermined gap such that it is possible to fill the solder paste S in the apertures 13 of the film 12 and form the coat of solder paste S on the film 12 by the movement of the second squeegee 20b to the second printing direction FB.

On the other hand, in the step of making the printing room 4 the condition opened to the atmospheric pressure, the control unit 100 allows the solder paste S forming the coat on the film 12 to be filled in the apertures 13 of the film 12 under atmospheric pressure. It also scrapes the coat of the solder paste S on the film 12 off by movement of the first squeegee 20b or the second squeegee 20b to their printing directions.

Thus, in the step of making the printing room 4 the condition opened to the atmospheric pressure, the control unit 100 sets the first squeegee 20a or the second squeegee 20b to be pressed onto the film 12.

In other words, by the control unit 100, the attack angle and the pressing force of the first squeegee 20a against the film 12 and the like are set so that it is possible to scrape the coat of the solder paste S on the film 12 off by means of the movement of first squeegee 20a to the first printing direction FA.

Alternatively, by the control unit 100, the attack angle and the pressing force of the second squeegee 20b against the film 12 and the like are set so that it is possible to scrape the coat of the solder paste S on the film 12 off by means of the movement of second squeegee 20b to the second printing direction FB.

In the setting of printing the solder paste S by reciprocating the first squeegee 20a and the second squeegee 20b, the control unit 100 allows one of the first squeegee 20a and the second squeegee 20b to fill the solder paste S in the apertures 13 of the film 12 and to form the coat of solder paste S on the film 12. It also allows the other of the first squeegee 20a and the second squeegee 20b to scrape the coat of solder paste S on the film 12 off.

In this embodiment, in a step of making the printing room 4 vacuum condition, the control unit 100 sets so as to have a predetermined gap between the lower end of the first squeegee 20a and the film 12 and retracts the second squeegee 20b upward. By the first squeegee 20a moved to the first printing direction FA, the solder paste S is filled in the apertures 13 of the film 12 and the coat of the solder paste S is formed on the film 12.

Moreover, in the step of making the printing room 4 the condition opened to the atmospheric pressure, the control unit 100 sets the second squeegee 20b to be pressed onto the film 12 and retracts the first squeegee 20a upward. By the second squeegee 20b moved to the second printing direction FB, the coat of the solder paste S on the film 12 is scraped off.

Operation Example of Solder Printing Machine According to this Embodiment

FIGS. 3A, 3B, 3C, 3D and 3E are motion illustration diagrams showing an example of a printing method of solder paste according to the embodiment. The following will describe a printing operation of the solder paste S in the solder printing machine according to the embodiment with reference to respective drawings.

As described above, in the substrate 11, the film 12 is attached to a surface thereof, on which the solder paste S is printed, and covers the positions of the electrodes or the like on which the solder paste S is printed. The ultraviolet rays are irradiated thereto. In the substrate 11, as shown in FIG. 3A, portions of the film 12 to which the ultraviolet rays are irradiated cure and any positions on which the solder paste S is not printed are covered by the film 12. Further, on the substrate 11, portions of the film 12 to which the ultraviolet rays are not irradiated are removed by chemicals or the like so that any apertures 13 having predetermined dimensions are formed with them being aligned to positions of the electrodes 14 or the like to which the solder paste S is printed.

In the solder printing machine 1A, the substrate 11 to which the film 12 is attached is set on the stage 30. The control unit 100 controls the stage-moving mechanism 31 to move the stage 30 vertically or horizontally so that the substrate 11 to which the film 12 is aligned thereto.

In a step of making the printing room 4 vacuum condition, the control unit 100 controls the first squeegee-elevator 23a to elevate the first squeegee 20a toward the raising or lowering direction UA so that a predetermined gap is formed between the film 12 attached to the substrate 11 and the first squeegee 20a.

In other words, the control unit 100 sets the interval H between the lower end of the first squeegee 20a and the film 12 to have a predetermined gap such that it is possible to fill the solder paste S in the apertures 13 of the film 12 and form the coat of solder paste S on the film 12 by the movement of the first squeegee 20a to the first printing direction FA. In this embodiment, the interval H between the lower end of the first squeegee 20a and the film 12 is set to about 1 mm. It is to be noted that in the step of making the printing room 4 vacuum condition, the second squeegee 20b is retracted upward.

The control unit 100 closes the valve 41 to keep the printing room 4 airtight and activates the vacuum pump 40 to exhaust air from the inside of the printing room 4 so that the inside of the printing room 4 becomes predetermined vacuum condition.

The control unit 100 controls the squeegee-moving mechanism 22 to maintain the gap between the film 12 attached to the substrate 11 and the first squeegee 20a and allows the first squeegee 20a to move toward the first printing direction FA. This enables the solder paste S supplied on the film 12 to be filled in the apertures 13 of the film 12 and enables the coat of the solder paste S to be formed on the film 12. In this embodiment, the coat of the solder paste S on the film 12 has a thickness of about 1 mm.

Figure 3C:
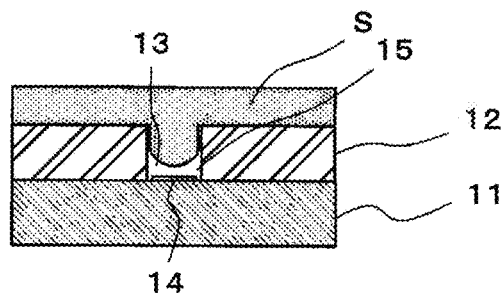
FIG. 3C is a motion illustration diagram showing the example of the printing method of solder paste according to the embodiment.

Here, in a case where the apertures 13 are minute and the aspect ratio thereof exceeds 0.5, even when the printing is performed under vacuum, the pressing of the squeegee may keep a gap 15 between the solder paste S and a bottom of the aperture 13, as shown in FIG. 3C, so that no solder paste S contact the electrode 14 on the bottom of the aperture 13.

Accordingly, by utilizing atmospheric pressure, the solder paste S, the solder paste S is filled in the apertures 13. In other words, the control unit 100 opens the valve 41 to open the printing room 4 from the vacuum condition to the atmospheric pressure.

Figure 3D:
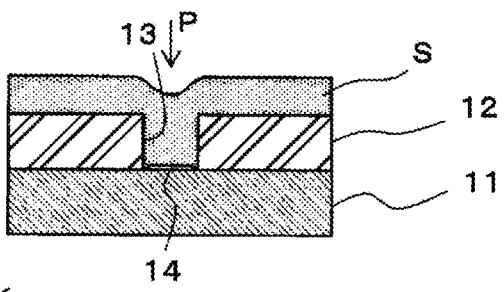
FIG. 3D is a motion illustration diagram showing the example of the printing method of solder paste according to the embodiment.

When the gap 15 is formed between the solder paste S and the bottom of the aperture 13, by opening the printing room 4 from the vacuum condition to the atmospheric pressure, this gap 15 becomes negative pressure so that the solder paste S forming the coat on the film 12 is pushed down into the aperture 13 under atmospheric pressure P as shown in FIG. 3D.

By forming the coat of the solder paste S on the film 12 so as to have a predetermined thickness in the step of making the printing room 4 vacuum condition, it is possible to fill the solder paste S in the entire of the aperture 13 through a thickness direction of the film 12 in the step of making the printing room 4 opened to the atmospheric pressure.

The control unit 100 controls the second squeegee-elevator 23b to move the second squeegee 20b toward the raising or lowering direction UB in the step of making the printing room 4 the condition opened to the atmospheric pressure so that the second squeegee 20b becomes pressed on the film 12 attached to the substrate 11.

In other words, the control unit 100 sets the attack angle and the pressing force by the second squeegee 20b against the film 12 and the like to a value such that the coat of the solder paste S on the film 12 can be scraped off by the movement of the second squeegee 20b to the second printing direction FB. It is to be noted that in the step of making the printing room 4 the condition opened to the atmospheric pressure, the first squeegee 20a is retracted upward.

Figure 3E:
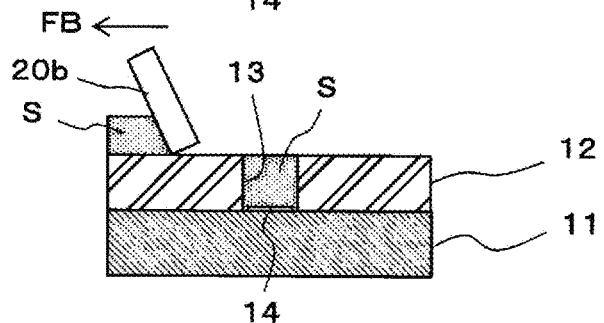
FIG. 3E is a motion illustration diagram showing the example of the printing method of solder paste according to the embodiment.

The control unit 100 controls the squeegee-moving mechanism 22 to maintain the situation where the second squeegee 20b is closely contacted with the film 12 attached to the substrate 11 and allows the second squeegee 20b to move toward the second printing direction FB. This enables the excessive coat of the solder paste S remained on the film 12 to be scraped off, as shown in FIG. 3E.

In the above-mentioned printing steps, by changing the printing room 4 between the vacuum condition and the condition open to the atmospheric pressure, it is possible to fill the solder paste S in the apertures 13 of the film 12 certainly using the pressure force by the squeegee and the atmospheric pressure even when the apertures 13 are minute.

The substrate in which the solder paste S is filled in the apertures 13 of the film 12 is heated in the reflow furnace and the solder paste S is fused so that solder bumps are formed. After the step of forming the solder bumps, the film 12 is removed off. This enables the solder bumps to be formed on the electrodes 14 on the substrate 11. In the printing step of the solder paste S, it is possible to fill the solder paste S in the apertures 13 of the film 12 certainly so that the solder bumps can be certainly formed on the electrodes 14 and the like of the substrate 11.

Here, in the screen printing utilizing a screen made of a steel plate, after the solder paste is printed on the substrate, the screen is separated from the substrate and only the substrate is heated in the reflow furnace. In a case where the pitch narrowing of the electrodes advances and the apertures formed in the screen become minute, even if the solder paste is certainly filled in the apertures, the solder paste may remain in the apertures of the screen when separating the screen from the substrate so that it is separated from the substrate.

On the other hand, in the film method using the film 12, as described above, after the solder paste S is filled in the apertures 13 of the film 12 using the solder printing machine 1A, the substrate 11 while the film 12 is attached thereto is heated in the reflow furnace. After the solder paste S is then fused by heating the substrate 11 to form the solder bumps, the film 12 is removed off. Thus, the solder bumps remain on a side of the electrodes 14 of the substrate 11, which prevents attaching them to a side of the film 12 from separating them from the electrodes 14.

In addition, in the above-mentioned printing method, by providing the predetermined gap between the first squeegee 20a and the film 12, the coat of the solder paste S is formed on the film 12 in the step of making the printing room 4 vacuum condition. In contrast, in the step of making the printing room 4 vacuum condition, the solder paste S can be printed while the first squeegee 20a closely contacts the film 12.

After the solder paste S is printed while the first squeegee 20a closely contacts the film 12 under vacuum condition, if any gap is formed between the solder paste S and the bottom of the aperture, this gap 15 becomes negative pressure when opening the printing room 4 to the atmospheric pressure. The solder paste S filled in the apertures 13 is then pushed down to the apertures 13 under atmospheric pressure. A shortage of the solder paste S by pushing it down to the apertures 13 under atmospheric pressure is supplied by scraping operation by the second squeegee 20b under atmospheric pressure.

Executed Example

The solder paste S according to this embodiment is printed on the substrate 11 while the printing room 4 of the solder printing machine 1A is made vacuum condition, as described above. Thus, since the solder paste S is exposed to any decompression environment as compared with the atmospheric pressure, it is necessary that a flux in the solder paste does not volatilize under the decompression pressure and it has a viscosity such that the solder paste S is filled in the apertures 13 during a short period of time when the printing room 4 is opened from the decompression condition to the atmospheric pressure.

The flux to be used in the solder paste S is made of solid contents and solvents. When solvent contents volatilize under vacuum condition, viscosity variation occurs in the solder paste S during the printing while the printing room 4 is under vacuum condition, which causes its print performance to be unstable. Accordingly, in order to select the solvent that is hard to volatilize during the printing under vacuum condition, degrees of volatilization of the solvents in vacuum were verified.

Solvents each of about 10 cc were put in laboratory dishes and the weights of the put solvents were measured. They were leaved under vacuum condition of 5 Pa and loss parts thereof in weight were measured for every one hour when they returned to the atmospheric pressure. Three species of solvents, which have different boiling points as shown in the following Table 1, were selected and losses in weight were measured on the basis of the species of the solvents.

TABLE 1

| NAME OF SOLVENT | BOILING POINT [° C.] |
| --- | --- |
| α TERPINEOL | 219 |
| HEXYLENE GLYCOL | 197.1 |
| OCTANEDIOL | 243.2 |

Figure 4:
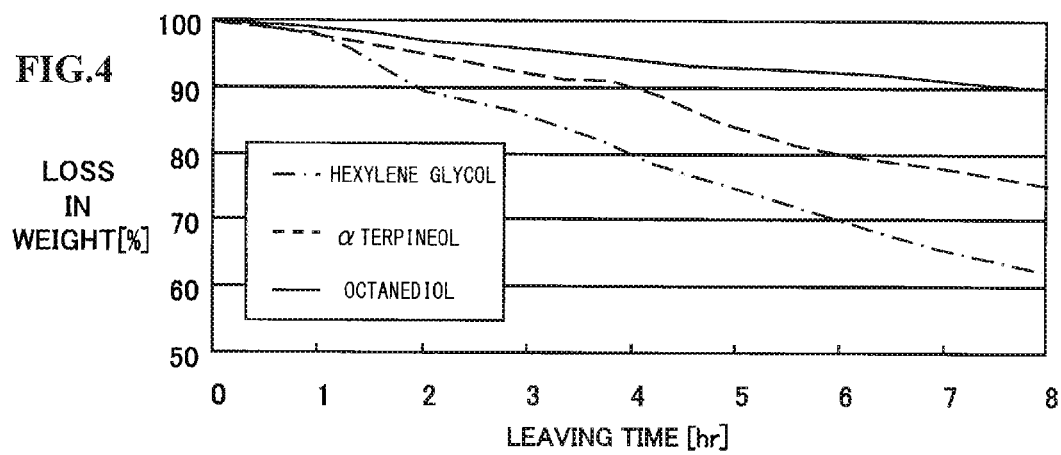
FIG. 4 is a graph showing a relationship between a leaving time and a loss in weight under vacuum condition.

FIG. 4 is a graph showing a relationship between a leaving time and a loss in weight under vacuum condition. As shown in FIG. 4, it was found that the degrees of losses in weight of the solvents were different from each other based on their boiling points as well as the solvent having lower boiling point was lost in more weight and there was less volatilization in the solvent having higher boiling point under vacuum condition.

Based on the verification results of the volatilization degree in vacuum as described above, as the solvent contained in the flux to be used in the solder paste S, s the solvent having the boiling point of 240° C. or more was selected. In this embodiment, octanediol having the boiling point of 243.2° C. is selected. The fluxes having compositions shown in the following Table 2 were prepared. It is to be noted that percentage in the each following composition is mass %.

TABLE 2

|  | A | B | C |
| --- | --- | --- | --- |
| PINE RESIN | 40% | 47% | 50% |
| OCTANEDIOL | 57% | 50.5% | 48% |
| HARDED CASTOR OIL | 3% | 2.5% | 2% |

The solder pastes were prepared by mixing each of the fluxes A through C shown in Table 2 and solder powders (Its composition: Sn-3Ag-0.5Cu, Powder size: 6 μm or less) so that the flux is 12% by mass %. Viscosity and thixotropic ratio of each of these solder pastes were measured.

On the measurement of the viscosity and the thixotropic ratio, double circular cylinder-type rotating viscometer was used. Each sample was set in the viscometer and the solder pastes were adjusted to 25° C. The viscosities were successively measured at number of rotations and periods of measuring time shown in the following Table 3. The thixotropic ratios were obtained by the following formula (1) from the viscosities of 3 rotations and 30 rotations wherein the value of viscosity is set to D.

TABLE 3

| NUMBERS OF ROTATION | 10 | 3 | 4 | 5 | 10 | 20 | 30 | 10 |
|---|---|---|---|---|---|---|---|---|
| PERIODS OF MEASURING TIME | 3 | 6 | 3 | 3 | 3 | 2 | 2 | 1 |
| VISCOSITY | | | | D | | | | |

[Formula 1]

$$\text{Thixotropic ratio} = \text{LOG}(\text{Viscosity of 3 rotations}/\text{Viscosity of 30 rotations}) \quad (1)$$

The viscosities and the thixotropic ratios of the solder pastes prepared by using the fluxes A through C shown in Table 2 will be shown in the following Table 4.

TABLE 4

| | A | B | C |
|---|---|---|---|
| VISCOSITIES [Pa · s] | 52 | 146 | 253 |
| THIXOTROPIC RATIOS | 0.48 | 0.33 | 0.21 |

Next, as the substrate to which the film is attached, silicon wafers of the specification shown in the following Table 5 were prepared, the solder pastes having the three species of viscosities shown in Table 4 were filled in the apertures, in the apertures, the solder was fused on a hot plate at 250° C. and solder bumps were formed. Thereafter, residue of the flux was washed out by cleaning liquid of hydrocarbon system and heights of the bumps were measured by an ultrasonic microscope. Numbers of measured points were 30 points.

TABLE 5

| ASPECT RATIO | DIAMETER OF APERTURE | THICKNESS |
|---|---|---|
| 1.3 | 50μ | 65μ |
| 1.67 | 60μ | 100μ |

As the executed examples, the above-mentioned solder printing machine, as shown in FIG. 1, which was switched between the vacuum condition and the condition opened to the atmospheric pressure, was used. The printing room 4 became under vacuum condition. The predetermined gap, in this example, about 1 mm, was formed between the squeegee and a surface to be printed and the printing was performed. The solder paste was filled in the apertures by the pressure force of the squeegee and the coat of the solder paste was formed. Next, the printing room was opened from the vacuum condition to the atmospheric pressure and the solder paste was filled in the apertures under atmospheric pressure and the excessive solder paste was scraped off while the squeegee closely contacted the space to be printed. As the comparison example, the same solder printing machine was used and the printing was performed under atmospheric pressure without any printing under vacuum condition. They were compared.

Figure 5:
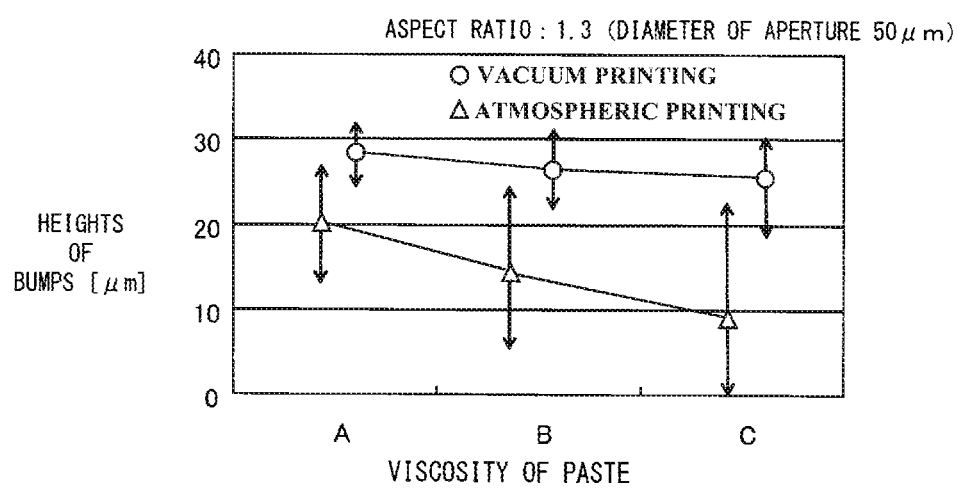
FIG. 5 is a graph showing a relationship between a viscosity of each of the solder pastes and the height of each of the solder bumps.
Figure 6:
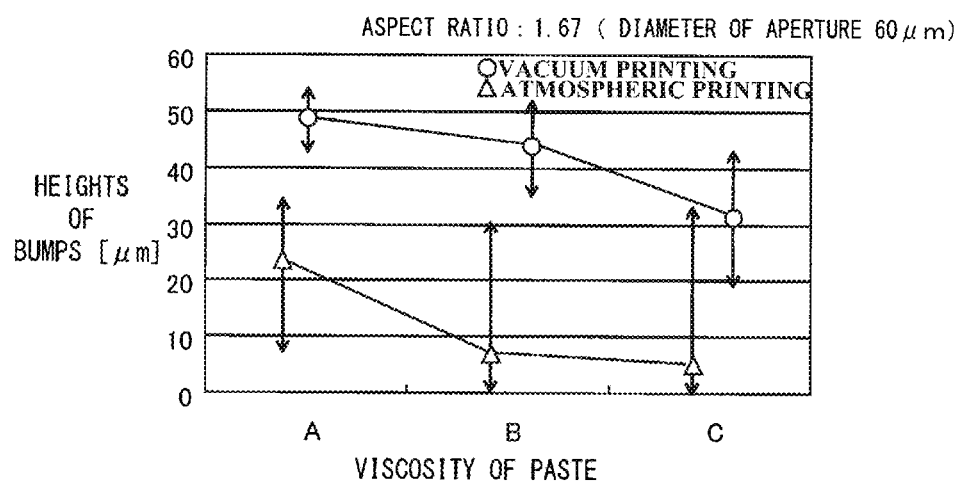
FIG. 6 is a graph showing a relationship between a viscosity of each of the solder pastes and the height of each of the solder bumps.

FIGS. 5 and 6 are graphs each showing a relationship between a viscosity of each of the solder pastes and the height of each of the solder bumps. FIG. 5 shows a case where the aspect ratio of the aperture is 1.3 and FIG. 6 shows a case where the aspect ratio of the aperture is 1.67.

Figure 7:
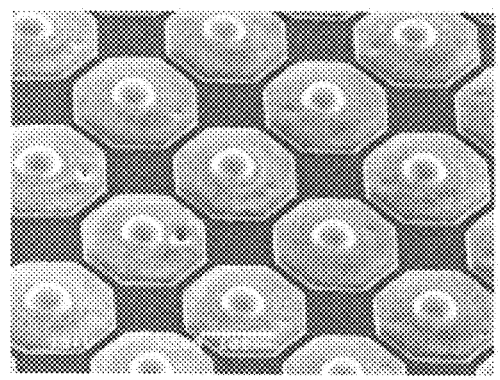
FIG. 7 is a microphotograph showing a solder hump's forming state as an executed example.
Figure 8:
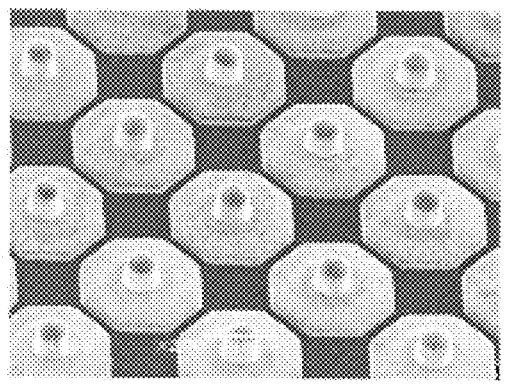
FIG. 8 is a microphotograph showing a solder hump's forming state as an executed example.
Figure 9:
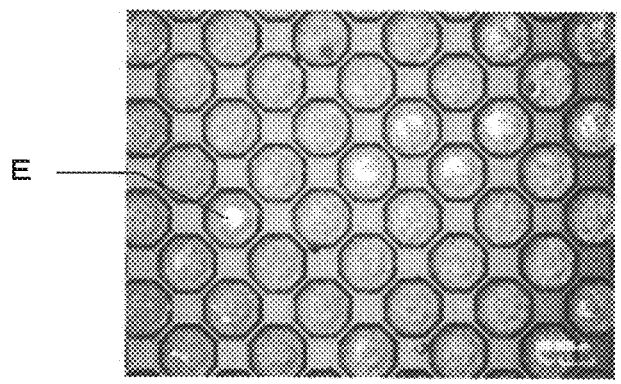
FIG. 9 is a microphotograph showing a state in which no solder bump is formed as a comparison example.
Figure 10A:
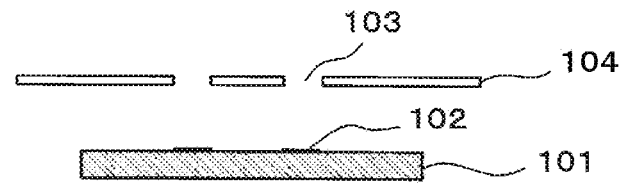
FIG. 10A is a motion illustration diagram showing an example of a conventional screen printing.
Figure 10B:
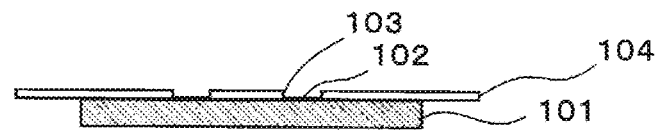
FIG. 10B is a motion illustration diagram showing the example of the conventional screen printing.
Figure 10C:
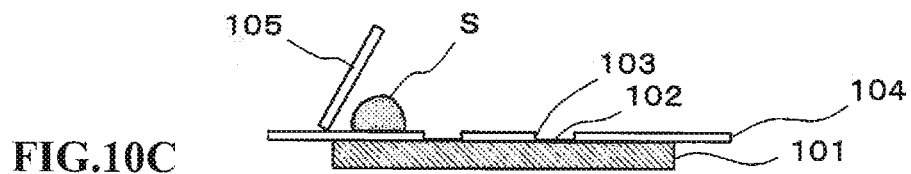
FIG. 10C is a motion illustration diagram showing the example of the conventional screen printing.
Figure 10D:
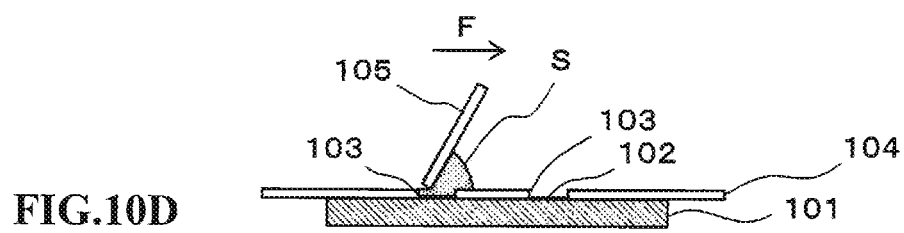
FIG. 10D is a motion illustration diagram showing the example of the conventional screen printing.
Figure 10E:
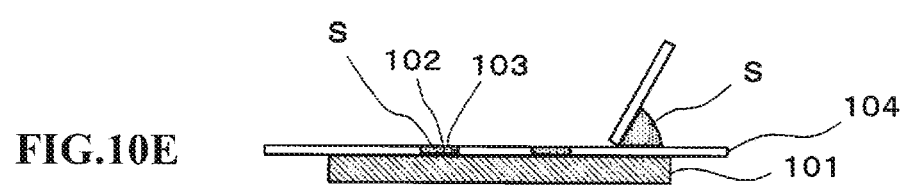
FIG. 10E is a motion illustration diagram showing the example of the conventional screen printing.
Figure 10F:
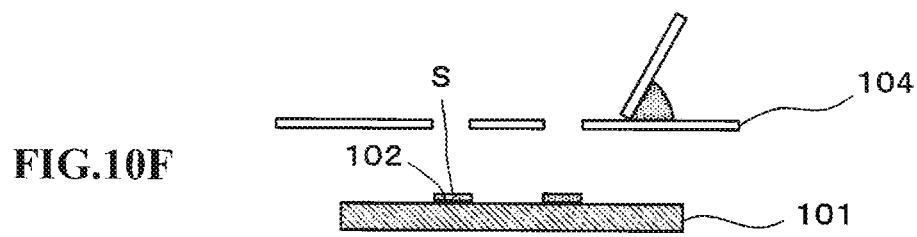
FIG. 10F is a motion illustration diagram showing the example of the conventional screen printing.
Figure 11A:
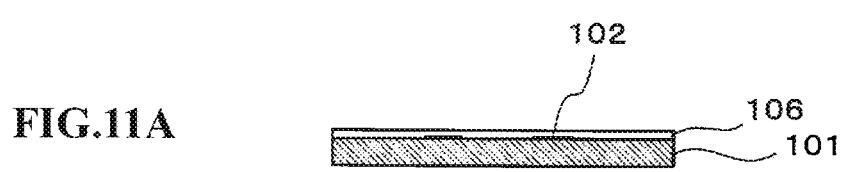
FIG. 11A is a motion illustration diagram showing an example of a conventional film method.
Figure 11B:
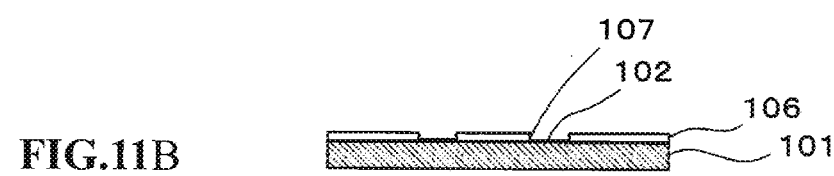
FIG. 11C is a motion illustration diagram showing the example of the conventional film method.
FIG. 11D is a motion illustration diagram showing the example of the conventional film method.
FIG. 11E is a motion illustration diagram showing the example of the conventional film method.
FIG. 11F is a motion illustration diagram showing the example of the conventional film method.
Figure 11C:
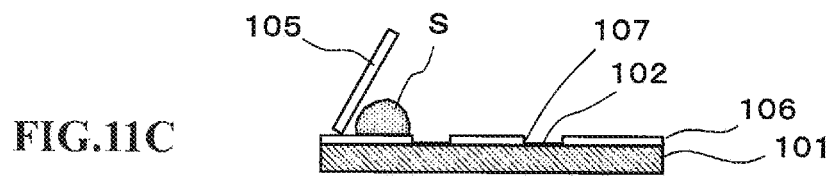
Figure 11D:
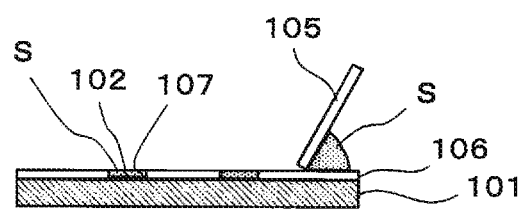
Figure 11E:
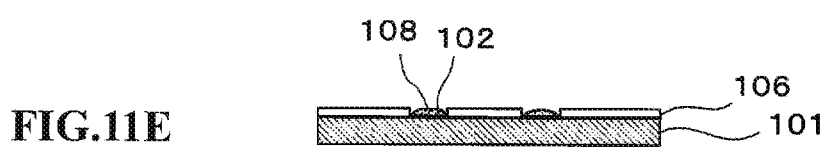
Figure 11F:
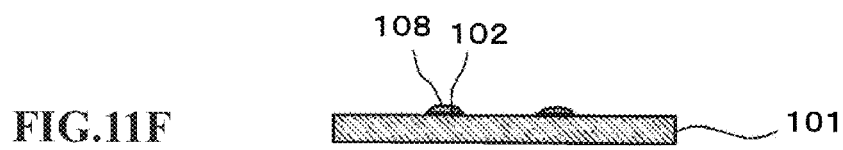
Figure 12A:
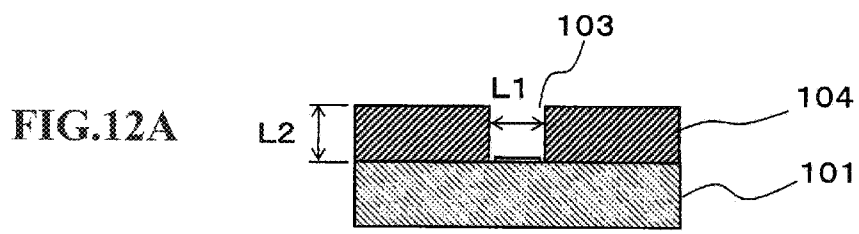
FIG. 12A is a schematic diagram showing a conventional problem.
Figure 12B:
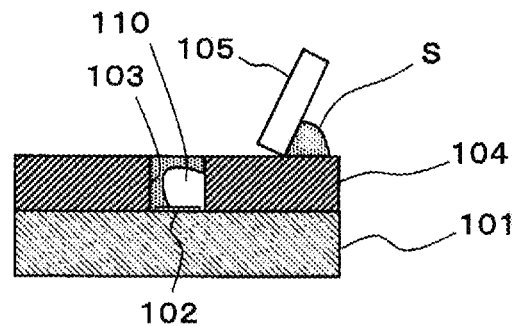
FIG. 12B is a schematic diagram showing the conventional problem.
Figure 12C:
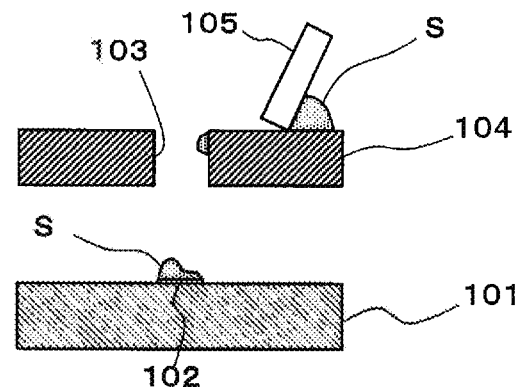
FIG. 12C is a schematic diagram showing the conventional problem.

FIGS. 7 and 8 are microphotographs each showing a solder bump's forming state as the executed examples. FIG. 7 shows a hump's forming state where the aspect ratio is 1.3 and FIG. 8 shows a hump's forming state where the aspect ratio is 1.67. FIG. 9 is a microphotograph showing a state in which no solder bump is formed as a comparison example.

In the graphs of FIGS. 5 and 6, an upper limit of each arrow shows the maximum value (max) of the heights of bumps and a lower limit of each arrow shows the minimum value (min) of the heights of bumps. Averages of the heights of bumps are plotted in the graphs. From the measured results of the heights of bumps, when the aspect ratio is increased, the heights of bumps become zero. In other words, it has been understood that a frequency of occurrence of the missing bump E in which no solder bump is formed, as shown in FIG. 9, is increased.

Further, it is understood that in the printing while the vacuum condition and the condition opened to the atmospheric pressure are switched and the printing only under atmospheric pressure condition, the heights of the bumps become higher and stable in the printing while the vacuum condition and the condition opened to the atmospheric pressure are switched. This means that the solder paste is stably filled in the apertures in the printing while the vacuum condition and the condition opened to the atmospheric pressure are switched.

On the other hand, in the viscosity of the solder paste, when the printing is performed while the vacuum condition and the condition opened to the atmospheric pressure are switched, it is understood that in the solder paste having the viscosity A and the solder paste having the viscosity B, shown in Table 4, the bumps become larger in heights stably as shown in FIGS. 7 and 8 in spite of dimensions of the aspect ratios. In contrast, in the solder paste having the viscosity C, when the aspect ratio is increased, the bumps become smaller in heights.

Based on the above verification results, when the printing is performed while the vacuum condition and the condition opened to the atmospheric pressure are switched, it is understood that by selecting the viscosity of the solder paste suitably, any stable bumps can be formed. In this example, when the solvent contained in the flux is octanediol having the boiling point of 240° C. or more and the solder paste has a viscosity of 50 through 150 Pa·s and a thixotropic ratio of 0.3 through 0.5, it is possible to fill the solder paste certainly in the apertures of the film in spite of dimensions of the aspect ratios. It is understood that this enables the solder bumps to be certainly formed on the electrodes of the substrate even when the apertures are minute, enables a variation in the heights of solder bumps to be controlled and enables the missing bumps to be prevented.

On the other hand, when it is applied to the screen printing, it is understood that it is possible to maintain print amount certainly in spite of dimensions of the aspect ratios.

Here, when the boiling point of the solvent constituting the flux is high, it is difficult to volatilize at a heating time for fusing the solder paste so that it becomes flux residue in a liquid state. Therefore, it is easy to wash the residue. Thus, in an application for washing the flux residue to remove it, an effect such that it is easy to wash the flux residue is obtained when the boiling point of the solvent constituting the flux is high.

INDUSTRIAL APPLICABILITY

The solder paste according to the invention is applicable to a manufacture of electronic components in which a plurality of solder bumps is formed with narrow pitch.

DESCRIPTION OF CODES

1A . . . Solder Printing Machine; 2 . . . Printing Mechanism; 3 . . . Substrate-supporting Mechanism; 4 . . . Printing Room; 20a . . . First Squeegee; 20b . . . Second Squeegee; 22 . . . Squeegee-moving Mechanism; 23a . . . First Squeegee-elevator; 23b . . . second Squeegee-elevator; 40 . . . Vacuum Pump; 41 . . . Valve; and 100 . . . Control Unit

What is claimed is:

1. A method of printing solder paste that comprises flux mixed with solder powder onto a substrate, through a mask member in which an aperture is defined, the method comprising:

providing a mask member that defines an aperture;

supplying a quantity of the solder paste to the aperture and the mask member under an ambient pressure that is less than atmospheric pressure, by use of a squeegee, while providing and maintaining a predetermined gap between the mask and the squeegee, and moving the squeegee along the mask while maintaining the predetermined gap between the mask and the squeegee, without contact between the mask and the squeegee, and maintaining the ambient pressure that is less than the atmospheric pressure, and thereby forming a film of the solder paste on the mask member and depositing a quantity of solder paste in the aperture;

moving a part of the solder paste forming the film on the mask member into the aperture, by increasing the ambient pressure to atmospheric pressure from the pressure that is less than atmospheric pressure; and thereafter scraping off an excess portion of the solder paste on the mask member and the aperture by moving the squeegee or another squeegee along the mask while maintaining the atmospheric pressure and pressing the squeegee or the other squeegee onto the mask member.

2. The method of printing according to claim 1 wherein the flux contained in the solder paste includes a solvent that includes octanediol and that remains in flux residue after the solder paste is heated, the solvent having a boiling point of at least 240° C., and the solder paste having a viscosity in the range of 50 Pa·s through 150 Pa·s and a thixotropic ratio in the range of 0.3 through 0.5, whereby after the solder paste is supplied to the aperture of the mask member under the ambient pressure that is less than atmospheric pressure, when the aperture has a diameter of 50 μm or more and an aspect ratio in the range of 0.5 through 1.67, the solder paste fills the aperture when the ambient pressure is increased to atmospheric pressure from the pressure that is less than atmospheric pressure.

* * * * *